(12) United States Patent
Giordani

(10) Patent No.: US 6,833,079 B1
(45) Date of Patent: Dec. 21, 2004

(54) METHOD OF ETCHING A SHAPED CAVITY

(75) Inventor: Sara Giordani, Den Haag (NL)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/506,425

(22) Filed: Feb. 17, 2000

(51) Int. Cl.$^7$ .............................. H01L 21/00
(52) U.S. Cl. .................. 216/2; 216/39; 216/46; 216/67; 216/72; 438/696; 438/714; 438/719; 438/723
(58) Field of Search ................. 216/2, 6, 39, 46, 216/67, 72, 79; 438/676, 714, 719, 723

(56) References Cited

U.S. PATENT DOCUMENTS

| | | | |
|---|---|---|---|
| 4,895,810 A | | 1/1990 | Meyer et al. .................. 431/41 |
| 5,013,400 A | * | 5/1991 | Kurasaki et al. ............. 156/345 |
| 5,155,053 A | * | 10/1992 | Atkinson ..................... 438/577 |
| 5,182,234 A | | 1/1993 | Meyer ......................... 437/233 |
| 5,229,315 A | | 7/1993 | Jun et al. ...................... 437/67 |
| 5,318,665 A | | 6/1994 | Oikawa ....................... 156/643 |
| 5,656,535 A | | 8/1997 | Ho et al. ...................... 438/386 |
| 5,891,807 A | * | 4/1999 | Muller et al. ................ 438/713 |
| 6,071,823 A | * | 6/2000 | Hung et al. .................... 216/67 |
| 6,303,513 B1 | * | 10/2001 | Khan et al. .................. 156/345 |
| 6,306,772 B1 | * | 10/2001 | Lin et al. ..................... 438/700 |
| 6,310,375 B1 | * | 10/2001 | Schrems ...................... 257/300 |

FOREIGN PATENT DOCUMENTS

| | | | |
|---|---|---|---|
| EP | 0272143 | 6/1988 | ......... H01L/21/306 |
| EP | 0565212 | 10/1993 | ......... H01L/21/306 |
| EP | 0727807 | 8/1996 | ............ H01J/37/32 |
| EP | 0884401 | 12/1996 | ........... C23C/16/44 |
| EP | 0821409 | 1/1998 | ....... H01L/21/8242 |
| EP | 0822593 | 2/1998 | ....... H01L/21/8242 |
| EP | 0908936 | 4/1999 | ......... H01L/21/306 |
| JP | 58134445 | 8/1983 | ........... H01L/21/76 |
| JP | 03203326 | 9/1991 | ......... H01L/21/302 |
| JP | 05102142 | 4/1993 | ....... H01L/21/3205 |
| JP | 06077175 | 3/1994 | ......... H01L/21/302 |

OTHER PUBLICATIONS

M. Sato et al., "Effect of Gas Species on the Depth Reduction in Silicon Deep–Submicron Trench Reactive IOn Etching", *Jap. J. Appl. Physics*, vol. 30, No. 7, pp. 1549–15555 (1991).

G. Yeom et al., "Polysilicon Etch Back Plasma Process Using HBr, $Cl_2$, and $SF_6$ Gas Mixtures for Deep–Trench Isolation", *J. Electrochem. Soc.*, vol. 139, No. 2, pp. 575–579 (1992).

U.S. patent application Ser. No. 09/144,008, of Lill et al., filed Aug. 31, 1998.

U.S. patent application Ser. No. 09/372,477, by Podlesnik et al., filed Aug. 11, 1999.

R. Pinto et al., "Reactive Ion Etching in $SF_6$ Gas Mixtures", *J. Electrochem Soc.: Solid–State Science and Technology*, vol. 134; No. 1, pp. 165–175 (1987).

Copy of Search Report in corresponding International Patent Application No. PCT/US01/05194, mailed Sep. 14, 2001.

* cited by examiner

*Primary Examiner*—Allan Olsen
(74) *Attorney, Agent, or Firm*—Shirley L. Church; Joseph Bach; Kathi Bean

(57) ABSTRACT

The present disclosure pertains to our discovery of a method of etching a shaped cavity in a substrate, where the shaped cavity has a width that is at least as great as its depth. We have discovered that by varying the process chamber pressure during etching of the shaped cavity, we can control lateral etching of the shaped cavity, while allowing the removal of etch process byproducts from the shaped cavity during continued etching. The method of the invention can be used to etch shaped cavities having round or horizontal elliptical shapes. The method of the invention is particularly useful in the etching of buried cavities, where removal of etch byproducts from the cavity can be difficult.

37 Claims, 5 Drawing Sheets

METHOD OF ETCHING A SHAPED CAVITY

BACKGROUND OF THE INVENTION

1. Field of the Invention

The present invention pertains to a method of etching a shaped cavity in a substrate. In particular, the present invention pertains to a method for etching a shaped cavity, where the width of the shaped cavity is equal to or greater than the depth of the shaped cavity in the substrate.

2. Brief Description of the Background Art

Commonly owned, copending U.S. application Ser. No. 09/372,477, filed Aug. 11, 1999, of Podlesnik et al., provides a general method for forming a multi-part cavity in a substrate which is useful in many different micromachining applications. As disclosed by Podlesnik et al., a substrate is etched to a first predetermined depth to form a shaped opening. A conformal protective layer is then formed on at least the sidewall of the shaped opening. The protective layer comprises a material which has a different etch selectivity than the substrate material. If necessary, the protective layer is then anisotropically etched to remove portions of the protective layer which overlie the bottom of the shaped opening. Typically, at least a portion of the substrate at the bottom of the shaped opening is exposed prior to proceeding with subsequent etching. The substrate is then further etched to form a shaped cavity using an etchant gas which selectively etches the substrate relative to the protective layer.

For some applications it is desirous that the shaped cavity be formed to have a different shape than the shaped opening. For example, the opening to the cavity is tubular-shaped, while the shaped cavity has a width that is equal to or greater than its depth (i.e., a round or horizontal elliptical shaped cavity). A shaped cavity of such dimensions is particularly difficult to form using dry etching techniques. Formation of round shaped cavities has previously been accomplished using wet etch techniques. However, in recent years, the semiconductor manufacturing industry has been trending toward the use of dry etch techniques because of process integration and environmental considerations. Due to the difficulty of carrying the gaseous reactants into and reaction byproducts out of a cavity, the use of dry etch techniques has been limited to the widening of already formed shaped cavities by a relatively minor amount. Therefore, it would be desirable to provide a dry etch method that would result in the formation of a shaped cavity having a width that is equal to or greater than its depth. Lateral (as opposed to vertical) etch is dependent upon a number of factors during the etching process, including the incoming angle of the etchant species, the mean free path of the etchant species, and the ability of the etchant species to reach the surface to be etched. Furthermore, byproducts of the etch process must constantly be removed, and if these byproducts become trapped within a cavity being etched, etching may slow to an unacceptable rate or stop entirely, particularly in the lateral direction. When a conventional etch process is used, the desired lateral etch (if it can be achieved before etching stops) is typically accompanied by an undesired deeper vertical etch. Therefore, particularly during the etching of buried cavities, it is important to provide a means by which etch byproducts can be evacuated from the etch cavity during the etching process, in order to allow the desired amount of lateral etching without deepening of the cavity.

SUMMARY OF THE INVENTION

The present invention provides a method of dry etching a shaped cavity in a substrate. The method is useful for aspect ratios as high as at least 3.5:1, and is particularly useful where the width of the shaped cavity is equal to or greater than the depth of the shaped cavity in the substrate, i.e. where the aspect ratio is less than 1.

We have discovered that it is necessary to control the process chamber pressure in a particular manner during the performance of the etching process to permit etch byproduct removal from the shaped cavity at a rate which reduces or avoids the buildup of etch byproducts on interior surfaces of the shaped cavity. This permits continued etching of the shaped cavity. In general, the method of the invention comprises etching of a shaped cavity using at least two different process chamber pressures, including an initial process chamber pressure, followed by continued etching of the shaped cavity using at least one decreased process chamber pressure. The decreased process chamber pressure should be at least 25% lower than the initial process chamber pressure, and in several embodiments is about 30% to 50% lower than the initial process chamber pressure. An optional finishing or rounding of the etched cavity may be carried out after shaping of the cavity, in which the process pressure is increased; the amount of increase is typically up to about 90% of the initial process chamber pressure.

During the etching of a shaped cavity, the process chamber pressure may be lowered and then subsequently raised and relowered, as well, to provide for the removal of etch byproducts during a given etching step.

The method of the invention is particularly useful in the etching of buried cavities. The shaped cavity is typically formed to underlie a previously formed shaped opening.

The method of the invention can be performed as a continuous process, where the process chamber pressure is gradually lowered or raised and lowered, or as a multi-step process.

When the substrate is (single crystal)silicon, etching is typically performed using a plasma containing reactive fluorine species. The etchant plasma is commonly generated from a source gas comprising $SF_6$ and argon, provided at a flow rate which is process equipment dependent, and at an $SF_6$:argon ratio within the range of about 10:1 to about 2.5:1. When a round shaped cavity is desired, an $SF_6$:argon ratio of about 4:1 provides excellent results. Argon is used as an inert carrier for the $SF_6$, and ionized argon in conjunction with a substrate bias may be used to drive reactive fluorine species generated from $SF_6$ down through the shaped opening and into the shaped cavity.

Alternative primary etchant gases include gases such as $CF_4$, $Cl_2$, and HBr. Any of the primary etchant gases may be used alone or in combination with a compatible other primary etchant gas. For example, $CF_4$ may be used to replace $SF_6$ or may be added to $SF_6$ to obtain a desired effect. A primary etchant gas may be used in combination with an additive gas, such as, for example, Ar, $O_2$, HBr, $Cl_2$, or $N_2$, to provide better control over the surface finish or etch profile of the shaped cavity. Depending on the particular effect desired, the additive gas may be present during the entire duration of the method of the invention, or it may be present only during a certain step or steps. The plasma source gas may further include a substantially nonreactive, diluent gas, such as Ar, He, or Xe.

Examples of source gas combinations which are preferred for etching a silicon substrate, and not by way of limitation, include $SF_6/Ar/O_2$; $SF_6/Ar/HBr$; $SF_6/Ar/Cl_2$; and $SF_6/Cl_2$. $CF_4$ may replace $SF_6$ or may be added to $SF_6$ in any of these source gas combinations.

When the substrate is polysilicon, the plasma source gas typically includes $SF_6$ and/or $Cl_2$. For a silicon dioxide substrate, the plasma source gas typically includes $CF_4$ or $NF_3$, and etching is typically performed at a temperature within the range of about 50° C. to about 100° C. When the substrate is silicon nitride, the plasma source gas typically includes $SF_6$. When the substrate is a metal (such as aluminum or an aluminum alloy), the plasma source gas typically includes $Cl_2$. When the substrate is polyimide, the plasma source gas typically includes $CF_4$ and $O_2$. All of these examples are intended to be non-limiting.

When a fluorine-containing etchant plasma is used at a temperature below 50° C., the protective/masking layer preferably comprises silicon oxide. A silicon nitride protective/masking layer may be used if the plasma source gas does not contain fluorine. A metal or alloy protective/masking layer may be used if the plasma source gas does not contain chlorine.

BRIEF DESCRIPTION OF THE DRAWINGS

FIG. 1A shows a beginning structure 100 for practicing the general method of the invention. This structure is a shaped opening 104 etched in a substrate 102 to a first predetermined depth A.

FIG. 1B shows the structure of FIG. 1A following formation of a conformal protective layer 106 on the sidewall 108 and bottom 110 of shaped opening 104.

FIG. 1C shows the structure of FIG. 1B after the protective layer has been anisotropically etched to remove a portion of the protective layer which overlies the bottom 110 of shaped opening 104.

FIG. 1D shows the structure of FIG. 1C after the underlying substrate 102 has been etched using the multi-step etch method of the invention to form a shaped cavity 112 which underlies shaped opening 104. The shaped cavity 112 is etched to have a width B and a depth C, where the width B is equal to or greater than the depth C. In particular, here, width B is equal to depth C, so that the shaped cavity 112 is formed in a round, as shown.

DETAILED DESCRIPTION OF THE INVENTION

I. Definitions

Figure 1A:
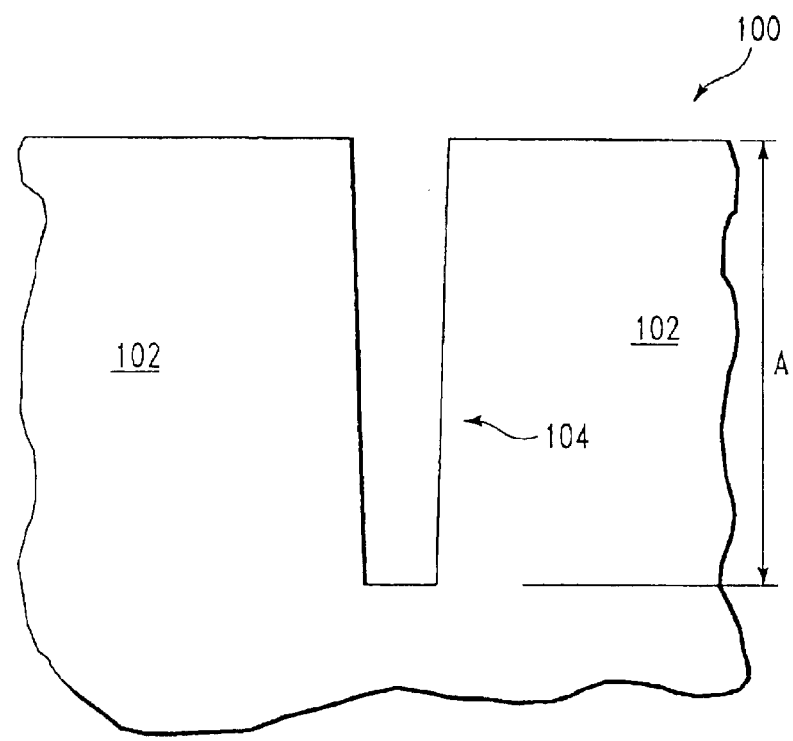
FIGS. 1A–1D illustrate one embodiment of the method of the invention.

As a preface to the detailed description, it should be noted that, as used in this specification and the appended claims, the singular forms "a", "an", and "the" include plural referents, unless the context clearly dictates otherwise. All percentages (%) listed for gas constituents are % by volume, unless otherwise indicated.

Specific terminology of particular importance to the description of the present invention is discussed below.

The term "cavity" typically refers to, but is not limited to, any three-dimensional depression or buried space in a substrate, including, for example and not by way of limitation, trenches, bowls, contacts, vias, tubes, holes, squares and other geometric shapes.

The term "eccentricity" refers to the ratio of the width of a shaped cavity to its depth. For example, a perfectly round shaped cavity (i.e., having a width exactly equal to its depth) would have an eccentricity of 1.

The term "polysilicon" refers to polycrystalline silicon, which may be doped with, for example and not by way of limitation, arsenic, phosphorus, antimony, or boron.

The term "substrate" refers to any material which can be etched using etching techniques known in the art.

II. Apparatus for Practicing the Invention

The method of the invention is generally performed in a plasma etching apparatus that is capable of enabling both anisotropic and isotropic etching, and is capable of switching back and forth between the two types of etching. An example of such an apparatus is the CENTURA® DPS™ polysilicon etch system, available from Applied Materials, Santa Clara, Calif. U.S. Pat. No. 5,753,044 issued to Hanawa et al. on May 19, 1998 contains a general description of an RF plasma reactor of the kind which may be used to practice the invention described herein.

III. A Method of Forming a Shaped Cavity in a Substrate

The present invention provides a method of dry etching a shaped cavity in a substrate. Although the method is useful for aspect ratios as high as at least 3.5:1, it is particularly useful where the width of the shaped cavity is equal to or greater than the depth of the shaped cavity in the substrate, i.e. where the aspect ratio is less than 1. For example, the shaped cavity can be etched to have a round shape, that is, the width of the shaped cavity is substantially equal to the depth of the shaped cavity. Alternatively, the shaped cavity can be etched to have a horizontal elliptical shape, that is, the width of the shaped cavity is substantially greater than the depth of the shaped cavity.

We have discovered that it is necessary to control the process chamber pressure in a particular manner during the performance of the etching process to permit etch byproduct removal from the shaped cavity at a rate which reduces or avoids the buildup of etch byproducts on interior surfaces of the shaped cavity. This permits continued etching of the shaped cavity. In general, the method of the invention comprises etching of a shaped cavity using at least two different process chamber pressures, including an initial process chamber pressure, followed by continued etching of the shaped cavity using at least one decreased process chamber pressure. The decreased process chamber pressure should be at least 25% lower than the initial process chamber pressure, and in several embodiments is about 30% to 50% lower than the initial process chamber pressure. The process chamber pressure may be lowered and then subsequently raised and relowered, as well. Such pressure changes permit etch byproducts formed during the etching process to be removed from the shaped cavity during continued etching.

The method of the invention is particularly useful in the etching of buried cavities. The shaped cavity is typically formed to underlie a previously formed shaped opening. In a preferred embodiment method of the invention, the following steps are typically performed prior to etching the shaped cavity: First, a substrate is etched to a predetermined depth to form a shaped opening. Then, a conformal protective layer is formed over at least a portion of the sidewall of the shaped opening. The protective layer comprises a material which has a different etch selectivity than the substrate material. If necessary, the protective layer is then anisotropically etched to remove portions of the protective layer which overlie the bottom of the shaped opening. Typically, a portion of the substrate at the bottom of the shaped opening is exposed prior to proceeding with subsequent etching, which occurs laterally beneath the bottom of the shaped opening. However, etching through the substrate laterally above the bottom of the shaped opening may be used, where the protective layer covers only the upper portion of the shaped opening. The protective/masking layer effectively preserves the profile of the protected portion of the shaped opening during subsequent etching of the shaped cavity. One method for formation of the protective layer is described in detail in commonly owned, copending U.S. application Ser. No. 09/372,477, filed Aug. 11, 1999, of Podlesnik et al., which is hereby incorporated by reference.

The substrate is typically a semiconductor substrate, which is frequently silicon; however, other substrates such as polysilicon, silicon dioxide, silicon nitride, metal (such as aluminum or an aluminum alloy), polyimide, gallium arsenide, cadmium indium telluride, doped silicon, doped polysilicon, doped silicon dioxide, tungsten, spin-on-glass (SOG), polymers, metal alloys (such as Al/Si/Cu or Al/Ti); other specialized substrates (which depend on the end use application) are contemplated as well. The silicon substrate may include doped regions (e.g., a buried dopant layer). Doped substrates may etch more readily or less readily than undoped substrates, depending on the dopant and on the etchant species. If silicon is used as the substrate material, a protective layer of silicon oxide can easily be formed using techniques known in the art (such as those described by Podlesnik et al.).

The method of the invention can be performed as a continuous process, where the process chamber pressure is gradually lowered or raised and lowered, or as a multi-step process.

One embodiment of the method of the invention comprises a multi-step etching method. In an initial cavity etch step, gaseous etchant species are introduced through a shaped opening, having a protective layer over at least a portion of its surface, in order to etch a shaped cavity. This embodiment is described with reference to a CENTURA® DPS™ process chamber or a similar process chamber, where etching of the shaped cavity is typically performed using an initial process chamber pressure within the range of about 20 mTorr to about 50 mTorr. Depending on the desired, predetermined shape of the cavity, a substrate bias may be applied to assist in obtaining the desired shape. When increased lateral etching is desired, a lower bias power, typically ranging from about 0 W to about 15 W, is commonly used. When increased vertical etching is desired, an increase in bias power is used, so that the bias power typically ranges from about 20 W to about 200 W.

When the substrate is (single crystal)silicon, etching is typically performed using a plasma containing reactive fluorine species. The etchant plasma is commonly generated from a source gas comprising $SF_6$ and argon, provided at a flow rate which is process equipment dependent, and at an $SF_6$:argon ratio within the range of about 10:1 to about 2.5:1. When a round shaped cavity is desired, an $SF_6$:argon ratio of about 4:1 provides excellent results. Argon is used as an inert carrier for the $SF_6$, and ionized argon in conjunction with a substrate bias may be used to drive reactive fluorine species generated from $SF_6$ down through the shaped opening and into the shaped cavity. When vertical etching is desired, a bias power within the range of about 20 W to about 200 W is typically used; when lateral etching is desired, a bias power within the range of about 0 W to about 15 W is typically used. The newly formed shaped cavity may be used as a reaction chamber during subsequent etching steps.

Typical process conditions for the initial cavity etch step fall within the following ranges: a process chamber pressure ranging from about 20 mTorr to about 50 mTorr; a source power ranging from about 600 W to about 900 W; a bias power ranging from about 0 W to about 15 W for more lateral etching, and ranging from about 20 W to about 200 W for more vertical etching; a substrate temperature ranging from about 20° C. to about 50° C.; and, a total gas flow of at least 100 sccm for a chamber volume of 35,000 cubic centimeters. When the primary etchant gas source is $SF_6$, the $SF_6$ is commonly combined with Ar, at an $SF_6$:Ar ratio ranging from about 2.5:1 to about 10:1, with the flow rate of $SF_6$, typically ranges from about 50–150 sccm.

Alternative primary etchant gases include gases such as $CF_4$, $Cl_2$, and HBr. Any of the primary etchant gases may be used alone or in combination with a compatible other primary etchant gas. For example, $CF_4$ may be used to replace $SF_6$ or may be added to $SF_6$ to obtain a desired effect. A primary etchant gas may be used in combination with an additive gas, such as, for example, Ar, $O_2$, HBr, $Cl_2$, or $N_2$, to provide better control over the surface finish or etch profile of the shaped cavity. Depending on the particular effect desired, the additive gas may be present during the entire duration of the method of the invention, or it may be present only during a certain step or steps. The plasma source gas may further include a substantially nonreactive, diluent gas, such as Ar, He, or Xe.

Examples of source gas combinations which are preferred for etching a silicon substrate, and not by way of limitation, include $SF_6/Ar/O_2$; $SF_6/Ar/HBr$; $SF_6/Ar/Cl_2$; and $SF_6/Cl_2$. $CF_4$ may replace $SF_6$ or may be added to $SF_6$ in any of these source gas combinations.

When the substrate is polysilicon, the plasma source gas typically includes $SF_6$ and/or $Cl_2$. When the substrate is silicon dioxide, the plasma source gas typically includes $CF_4$ or $NF_3$, and etching is typically performed at a temperature within the range of about 50° C. to about 100° C. When the substrate is silicon nitride, the plasma source gas typically includes $SF_6$. When the substrate is a metal (such as aluminum or an aluminum alloy), the plasma source gas typically includes $Cl_2$. When the substrate is polyimide, the plasma source gas typically includes $CF_4$ and $O_2$.

When a fluorine-containing etchant plasma is used at a temperature below 50° C., the protective/masking layer preferably comprises silicon oxide. A silicon nitride protective/masking layer may be used if the plasma source gas does not contain fluorine. A metal or alloy protective/masking layer may be used if the plasma source gas does not contain chlorine.

Returning to the embodiment described above pertaining to the initial cavity etch step in a silicon substrate, after the initial cavity etch step, a second etching step is performed in which the shaped cavity is enlarged in specific directions. The process chamber pressure used in the second etching step is preferably about 25–50% lower than the initial process chamber pressure. When a rounded shaped cavity is desired, decreasing the process chamber pressure by about 30% provides excellent results. A process chamber pressure within the range of about 10 mTorr to about 25 mTorr is typically employed during the second etching step. To expand the cavity in a lateral (horizontal) direction relative to the protected shaped opening, a bias power within the range of about 0 W to about 15 W is typically used. The plasma source gas used in the second etching step is typically the same as that used in the first etching step. Typical process conditions for the second etch step are as follows: a process chamber pressure ranging from about 10 mTorr to about 25 mTorr; a source power ranging from about 500W to about 800 W; a bias power ranging from about 0 W to about 15 W; a substrate temperature ranging from about 20° C. to about 50° C.; and a total gas flow of at least 100 sccm total gas flow (for a chamber volume of 35,000cc). For efficiency purposes the etchant source gas is $SF_6/Ar$, where the ratio of $SF_6$:Ar ranges from about 2.5:1 to about 10:1, where the $SF_6$ flow rate ranges between about 50 sccm to about 150 sccm.

In an optional third etching step, the process chamber pressure is decreased still further. Typically this step is a finishing or rounding step. The process chamber pressure used is typically about 40–50% lower than the process chamber pressure used during the second etching step. When a rounded shaped cavity is desired, decreasing the process chamber pressure by about 50% from the process chamber pressure used in the second etching step provides excellent results. A process chamber pressure within the range of about 5 mTorr to about 12 mTorr is typically employed, and excellent results were obtained using about 8 mTorr. The plasma source gas used in the optional third etching step is typically the same as that used in the first and second etching steps. Typical process conditions for the third etch step are as follows: a process chamber pressure ranging from about 5 mTorr to about 12 mTorr; a source power ranging from about 350 W to about 650 W; a bias power ranging from about 0 W to about 10 W; a substrate temperature ranging from about 20° C. to about 50° C.; an $SF_6/Ar$ etchant gas with an $SF_6$:Ar ratio ranging from about 2.5:1 to about 10:1, at an $SF_6$ flow rate ranging from about 50 sccm to about 150 sccm; and at least 100 sccm total gas flow (for a chamber volume of 35,000 cc).

In an optional etch finishing or rounding step, the process chamber pressure is increased to provide the shaped cavity with an increased concentration of reactive species at the surface of the cavity, after the removal of the etch process byproducts during the second and (if applicable) third etching steps. The process chamber pressure used during the etch finishing step need not be, but typically is lower than the initial process chamber pressure for the first step. When a round shaped cavity is desired, increasing the process chamber pressure to about 90%, of the initial process chamber pressure provides excellent results. A process chamber pressure within the range of about 18 mTorr to about 45 mTorr is typically employed during the optional etch finishing step.

The plasma source gas used in the etch finishing step may be of any composition which provides a desired surface finish (roughness) or chemical composition. When surface roughness is the only concern, the plasma source gas for a finishing step typically comprises the same components as that used in previous etching steps. However, relative amounts of the plasma source gas components may be adjusted. For example, the etchant species may be the fluorine-containing species previously described, used in combination with argon; however, the ratio of fluorine species to argon in the plasma source gas used in the etch finishing step is typically lower than that used in the previous steps. In the etch finishing step, the $SF_6$:Ar ratio of the plasma source gas is typically within the range of about 1.5:1 and about 5:1.

When a round shaped cavity is desired, an $SF_6$:Ar ratio of about 2.5:1 to about 3:1 provides excellent results. Surprisingly, we discovered that an $SF_6$:Ar ratio of 2.0:1 does not provide good results.

Typical process conditions for the etch finishing step are as follows: a process chamber pressure ranging from about 18 mTorr to about 45 mTorr; a source power ranging from about 500 W to about 800 W; a bias power ranging from about 0 W to about 15 W; a substrate temperature ranging from about 20° C. to about 50° C.; the $SF_6$:Ar ratio described above, where the $SF_6$ gas flow ranges from 50 sccm to about 150 sccm; and, at least 110 sccm total gas flow (for a chamber volume of 35,000 cc).

In more general terms within the method of the invention, a shaped opening is formed in a substrate, then the profile (i.e., shape) of the shaped opening is preserved by the formation of a protective layer (typically a conformal layer) over at least a portion of the inner surfaces of the shaped opening. Subsequently, a shaped cavity, underlying the shaped opening, is etched using a multi-step method performed at varying process chamber pressures.

Formation of the protective layer over at least a portion of the shaped opening generally preserves the shape of the opening and permits better control over the etch of the shaped cavity.

FIGS. 1A-1D illustrate the general method of the invention. Referring to FIG. 1A, a shaped opening 104 is etched in a substrate 102 to a predetermined depth A using etching techniques known in the art, depending on the substrate material. For example, but not by way of limitation, the substrate 102 may be pattern etched to form shaped opening 104 using a conventional organic photoresist, an inorganic hard mask, or a combination thereof.

As previously mentioned, the substrate 102 may comprise any material which can be etched using techniques known in the art. The Examples provided herein are with reference to silicon, although the general concepts of the invention can be applied to the use of other substrate materials.

Figure 1B:
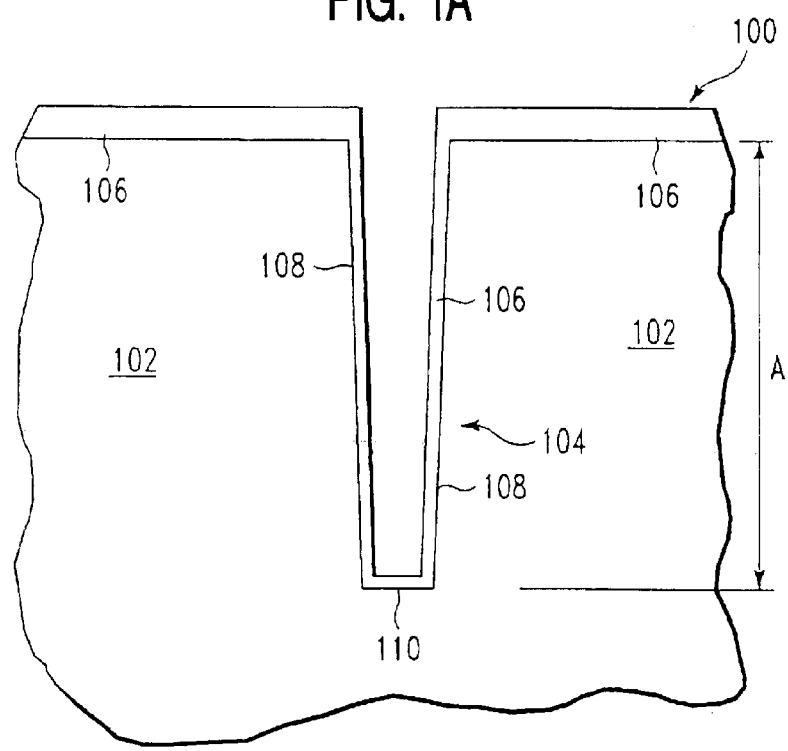

Referring to FIG. 1B, a conformal protective layer 106 is formed on at least the sidewall 108 of the shaped opening 104 using techniques known in the art, depending on the composition of the protective layer. The protective layer 106 may reach all the way to the bottom 110 of the shaped opening. However, in certain situations, such as for very high aspect ratios ($\geq 20:1$), the protective layer 106 may not be deposited on the bottom 110 of the shaped opening, depending on the feature size.

The conformal protective layer is deliberately formed on interior surfaces of the opening, as distinguished from layers made up of reaction byproducts which are incidentally deposited during various processing steps. To the extent that a byproduct layer is present on the interior surface of the opening, the byproduct layer may be left there if its presence serves a useful purpose, or it may be removed prior to application of the protective layer if it would interfere with subsequent processing steps.

The protective layer 106 comprises a material having a different etch selectivity than the substrate. In the case of a silicon substrate, a typical protective/masking layer may comprise, but is not limited to, silicon oxide, silicon nitride, silicon oxynitride, titanium nitride, aluminum, diamond, and polyimide. Silicon oxide and silicon nitride provide excellent etch selectivity relative to silicon.

In the case of a silicon oxide substrate, a typical protective/masking layer may comprise, but is not limited to, polysilicon, silicon nitride, titanium nitride, aluminum, diamond, and polyimide. Polysilicon and silicon nitride provide excellent etch selectivity relative to silicon oxide.

In the case of a silicon nitride substrate, a typical protective/masking layer may comprise, but is not limited to, polysilicon, silicon oxide, titanium nitride, aluminum, diamond, and polyimide. Polysilicon and silicon oxide provide excellent etch selectivity relative to silicon nitride.

In the case of an aluminum substrate, a typical protective/masking layer may comprise, but is not limited to, polyimide, titanium nitride, silicon oxide, and silicon nitride. Polyimide, silicon oxide, and silicon nitride provide excellent etch selectivity relative to aluminum.

In the case of an organic substrate, such as a polyimide, SILK, or BCB substrate, a typical protective/masking layer may comprise, but is not limited to, silicon oxide, silicon nitride, aluminum, and titanium nitride. Silicon oxide and silicon nitride provide excellent etch selectivity relative to polyimide, SILK, and BCB.

The thickness of the protective layer 106 on interior surfaces of the shaped opening 104 is dependent on the size of the feature to be etched, the aspect ratio of the feature, and the difference in etch rate between the protective layer and the substrate. For a given feature size of 1–2 $\mu$m, a typical protective layer has a thickness ranging from about 1000 Å to about 2000 Å. The required protective layer thickness for a particular application can be determined with minimal experimentation, in view of the known art.

Figure 1C:
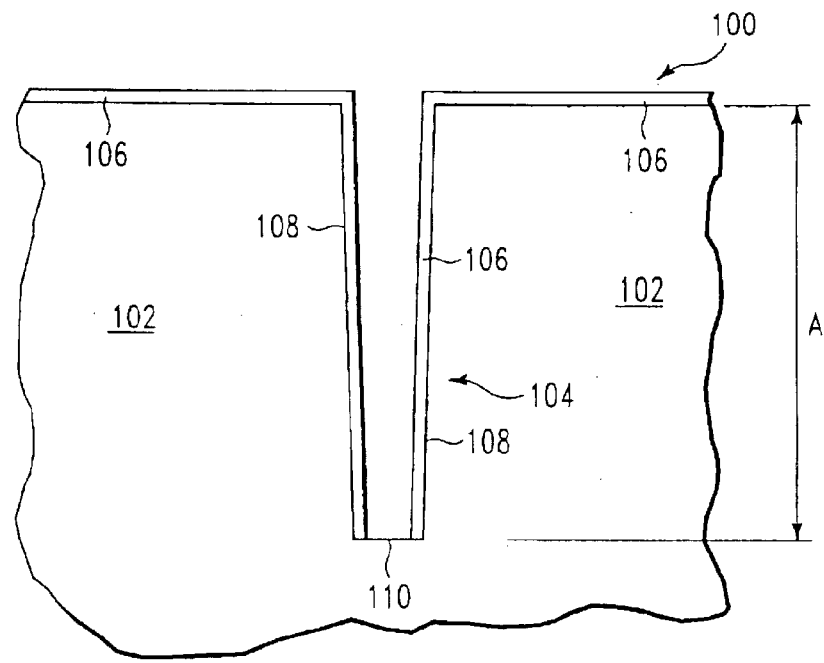

Referring to FIG. 1C, the protective layer 106 may be anistropically etched to remove portions of the protective layer which overlie the bottom 110 of the shaped opening 104. Anisotropic etching is performed using apparatus and techniques known in the art.

A shaped cavity is then etched in the substrate underlying the shaped opening according to the method of the invention. An etchant is selected which selectively etches the substrate relative to the protective layer (i.e., the substrate is etched at a much faster rate than the protective layer) during the performance of the method of the invention. The protective layer effectively preserves the profile of the shaped opening during etching of the underlying shaped cavity.

According to the first step of a preferred embodiment method of the invention where the substrate is silicon, gaseous etchant species are introduced through the shaped opening in order to etch an underlying shaped cavity. Etching of the shaped cavity is generally performed using a relatively high process chamber pressure within the range of about 20 mTorr and about 50 mTorr. Typically, a substrate bias voltage is applied, with the amount of voltage depending on the degree of anisotropicity (i.e., vertical relative to horizontal etching) desired. The higher the voltage, the more vertical the etch. When increased vertical etching is desired, a higher bias power, typically ranging from about 20 W to about 200 W, is typically used. When increased lateral etching is desired, a lower bias power, typically ranging from about 0 W to about 15 W, is typically used.

When the substrate is silicon and the protective layer is silicon oxide, etching is typically performed using a plasma containing reactive fluorine species. The etchant plasma is commonly generated from a source gas comprising $SF_6$ and argon, provided at a flow rate which is process equipment dependent, and at an $SF_6$:argon ratio within the range of about 10:1 and about 2.5:1. When a round shaped cavity is desired, an $SF_6$:argon ratio of about 4:1 provides excellent results. Argon is used as a chemically inert carrier for the $SF_6$, and ionized argon in conjunction with a substrate bias may be used to drive reactive fluorine species generated from $SF_6$ down through the shaped opening and into the shaped cavity. Further, high energy argon species provide physical bombardment of the substrate, assisting in the etch process. The newly formed shaped cavity may be used as a reaction chamber during subsequent etching steps.

The plasma source gas may further include an additive gas for the purpose of controlling various properties of the shaped cavity, such as the shape or the surface finish of the shaped cavity. Typical additive gases include, but are not limited to, $O_2$, HBr, $Cl_2$, and $N_2$. For example, the addition of $O_2$ to the plasma source gas will result in a shaped cavity having a roughened internal surface, whereas the addition of $Cl_2$ will lead to a smooth internal surface. HBr provides effective profile control during etching of the shaped cavity. Depending on the particular effect desired, the additive gas may be present during the entire duration of the method of the invention, or it may be present only during a certain step or steps. For example, if a particular finish is required on the surface of the final shaped cavity, an additive gas such as $O_2$ or $Cl_2$ is typically added during the final finishing step described below.

After the initial cavity etch step, a second etch step is performed during which the process chamber pressure is decreased in order to allow the removal of etch byproducts from the shaped cavity. This permits the subsequent introduction of fresh etchant species and helps prevent the buildup of etch byproducts on interior surfaces of the shaped cavity. The process chamber pressure used in the second etching step is typically about 30% lower than the process chamber pressure during the initial cavity etch step. A process chamber pressure within the range of about 10 mTorr to about 25 mTorr is typically employed during the second etching step. By way of example, and not by way of limitation, when a round shaped cavity is desired, decreasing the process chamber pressure by about 25–50% from the process chamber pressure in the initial etch step provides excellent results. To obtain a round shaped cavity, a bias power within the range of about 0 W to about 15 W is typical. The plasma source gas used during the continued etching may be different, but for process simplicity, it is preferably the same as that used during the initial cavity etching. An additive gas, such as those described above, may further be included in the plasma source gas during continued etching.

In an optional third etching step, the process chamber pressure is decreased still further. The process chamber pressure used in the optional third etching step is typically about 40–50% lower than the process chamber pressure used during the second etching step. By way of example, and not by way of limitation, when a round shaped cavity is desired, decreasing the process chamber pressure by about 50% from the process chamber pressure used in the second etching step provides excellent results. A process chamber pressure within the range of about 5 mTorr to about 12 mTorr is typically employed during the optional third etching step. When the cavity is to be further expanded in a lateral direction, a bias power within the range of about 0 W to about 10 W is typically used. For process simplicity, the plasma source gas used in the optional third etching step is typically the same as that used in the initial cavity etching.

In an optional etch finishing step, the process chamber pressure is increased to provide the shaped cavity with an increased concentration of reactive species following the reduction in concentration due to removal of the etch process byproducts during the second and optional third etching steps. The process chamber pressure used during the etch finishing step may be, but is not necessarily, lower than the process chamber pressure during the initial cavity etch step. By way of example, and not by way of limitation, in the etch finishing step, the process chamber pressure is typically increased to about 80–100% of the process chamber pressure used during the initial cavity etch step. When a round shaped cavity is desired, increasing the process chamber pressure to about 90% of the initial etch step process chamber pressure provides excellent results. A process chamber pressure within the range of about 18 mTorr and about 45 mTorr is typically employed during the optional etch finishing step. When the emphasis in this step is on lateral etching, a bias power within the range of about 0 W to about 15 W is typically applied. The plasma source gas used in the etch finishing step is the same as that used in the first and second etching steps.

The plasma source gas used in the etch finishing step typically comprises the same components as that used in the first and second etching steps. However, increasing the argon flow rate or lowering the ratio of fluorine species to argon in the plasma source gas used in the etch finishing step provides a higher carrier flow to ensure that etchants will travel into the cavity and react as desired. If no passivant species (such as HBr or $O_2$) are added to the gas mixture, and if there is an adequate dilution of $SF_6$ in argon (as described above), smoother interior cavity surfaces will be obtained. The addition of $O_2$ to the plasma source gas will result in some roughness on the internal cavity surface. On the other hand, $Cl_2$ addition should result in a smoother cavity surface.

In the etch finishing step, the $SF_6$:argon ratio of the plasma source gas is typically within the range of about 5:1 and about 1.5:1. When a round shaped cavity is desired, an $SF_6$:argon ratio of about 3:1 to about 2.5:1 provides excellent results.

Figure 1D:
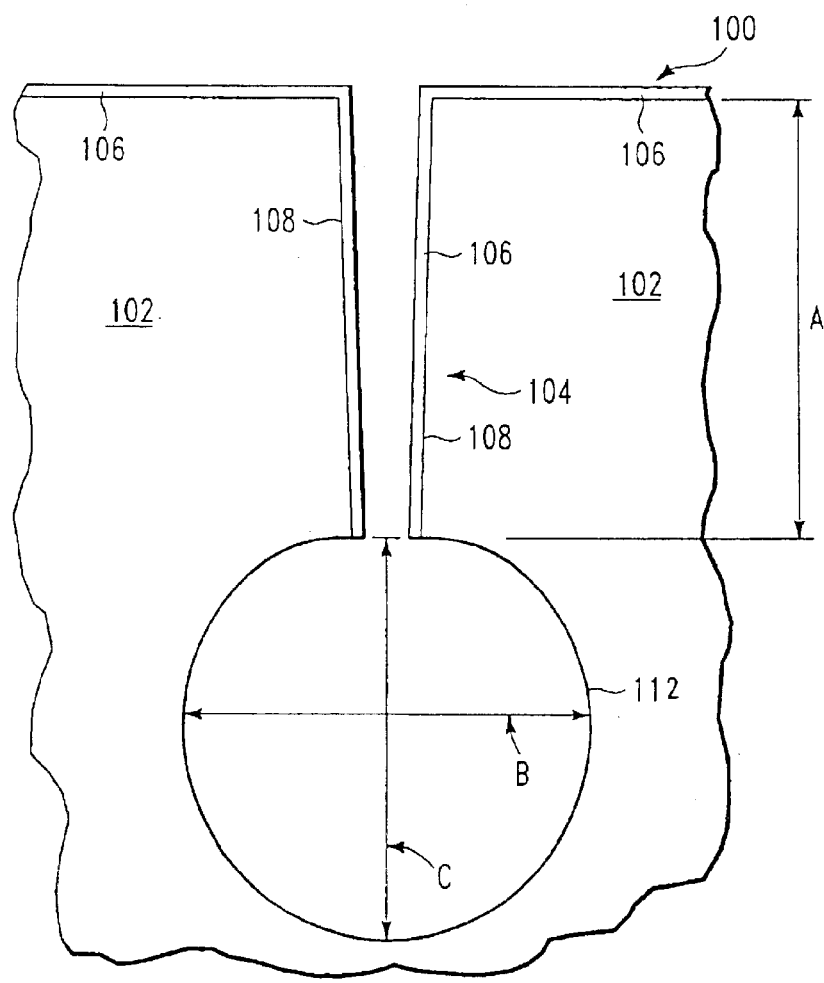

FIG. 1D shows the structure of FIG. 1C after etching of shaped cavity 112 using the method of the invention. The shaped cavity 112 is etched to have a width B and a depth C, where the width B is equal to or greater than the depth C. As shown in FIG. 1D, the shaped cavity 112 directly underlies and is in continuous communication with the shaped opening 104. The protective layer 106 effectively preserves the profile of the shaped opening 104 during etching of the underlying shaped cavity 112 using the method of the invention. The shaped cavity 112 shown in FIG. 1D has been etched so that the width B is approximately equal to the depth C, resulting in the formation of a substantially round shaped cavity.

For purposes of comparison, the typical process conditions for each step of the preferred embodiment method of the invention are presented in Table One, below.

TABLE ONE

Typical Process Conditions During Etch of a Shaped Cavity

| Process Condition | Step One | Step Two | Step Three | Step Four |
|---|---|---|---|---|
| Total Gas Flow (sccm) | ≧100 | ≧100 | ≧100 | ≧1 |
| $SF_6$ Flow Rate (sccm) | 50–150 | 50–150 | 50–150 | 50–150 |
| $SF_6$:Ar Flow Rate Ratio | 10:1–1.5:1 | 10:1–1.5:1 | 10:1–1.5:1 | 10:1–1.5:1 |

TABLE ONE-continued

Typical Process Conditions During Etch of a Shaped Cavity

| Process Condition | Step One | Step Two | Step Three | Step Four |
|---|---|---|---|---|
| Substrate Temperature (° C.) | 20–50 | 20–50 | 20–50 | 20–50 |
| Process Chamber Pressure (mTorr) | 20–50 | 10–25 | 5–12 | 18–45 |
| Source Power (W) | 600–900 | 500–800 | 350–650 | 500–800 |
| Bias Power (W) | 20–200 | 0–15 | 0–10 | 0–15 |

Any number of reductions in process chamber pressure, changes in substrate bias voltage, and changes in plasma source gas composition and/or plasma source power may be used to etch the desired shaped cavity.

Figure 2:
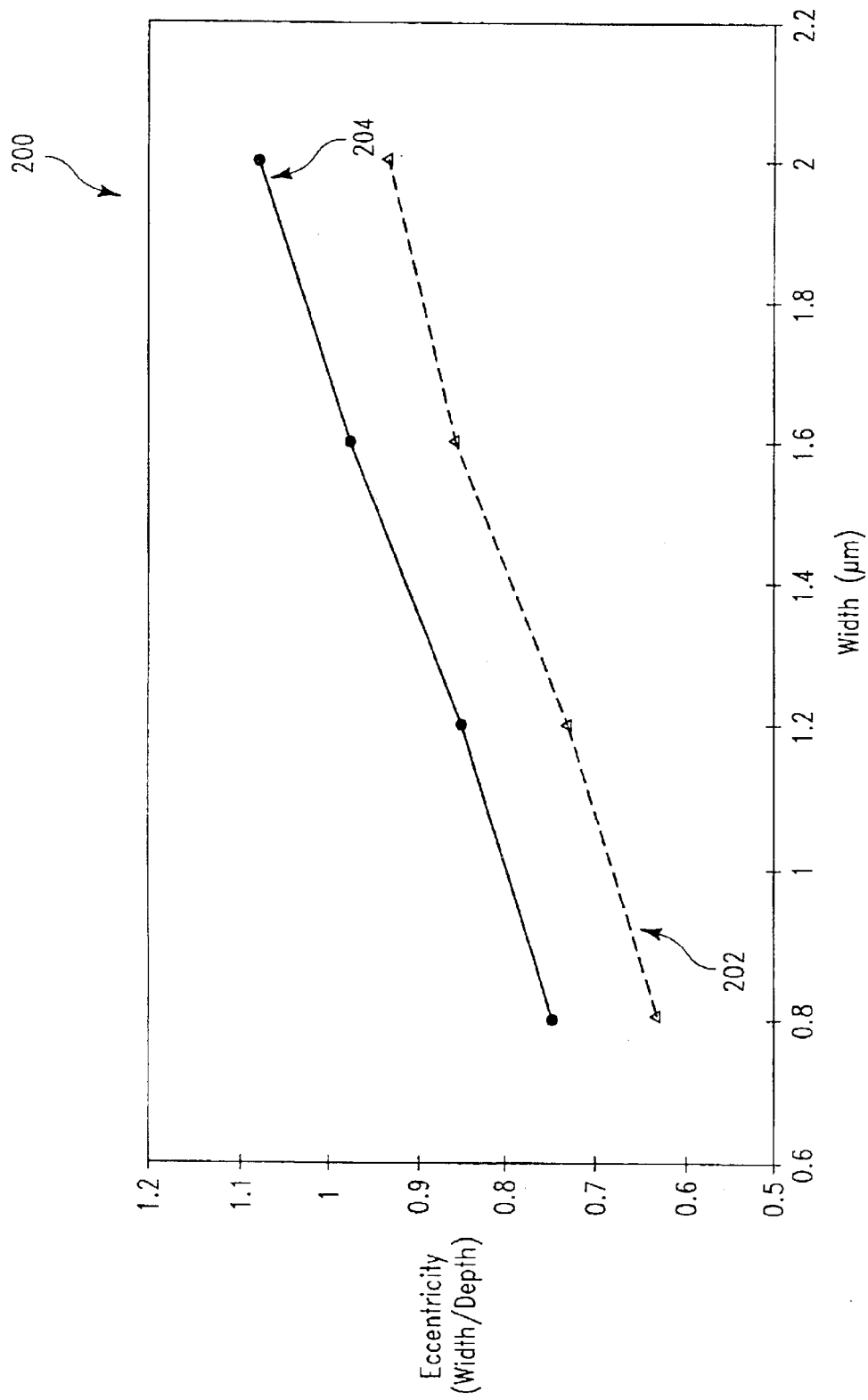
FIG. 2 shows a graph 200 of eccentricity (i.e., the width of a shaped cavity divided by its depth) as a function of the width of the overlying shaped opening, where curve 202 represents shaped cavities etched using a prior art etch process, and curve 204 represents shaped cavities etched using the method of the invention.

FIG. 2 shows a graph 200 of eccentricity (i.e., the width of a shaped cavity divided by its depth) as a function of the width of the overlying shaped opening, for shaped cavities etched using a prior art etch process, represented by curve 202, and for shaped cavities etched using the method of the invention, represented by curve 204. As shown in FIG. 2, for a given shaped opening width, a shaped cavity etched using the method of the invention has a greater eccentricity than one that was etched using a conventional etch process. For example, for a shaped opening width of 2 $\mu$m, a shaped cavity etched using the method of the present invention has an eccentricity of about 1.08, whereas a shaped cavity etched using a conventional etch process has an eccentricity of about 0.92. This indicates that the shaped cavity etched using the method of the invention may be wider than it is deep, whereas the shaped cavity etched using the conventional etch process must be deeper than it is wide.

The method of the invention is useful in many different applications. The method of the invention can be applied to any application where it is necessary or desirable to provide a structure having a shaped opening and an underlying shaped cavity having varying shapes, and where it is necessary to maintain tight control over the dimensions of the shaped opening. For example, the method of the invention can be used for micromachining of test chips for performance of various chemical or biological assays (e.g., genome testing), wherein the testing reagents would be contained in a plurality of shaped cavities etched in the chip. The method of the invention can also be used for micromachining of electrostatically controlled nozzles for use in inkjet printers, wherein the ink would be contained in the shaped cavity and the shaped opening would function as a nozzle. The method of the invention allows for excellent control over the critical dimensions of the shaped opening (e.g., the diameter of the nozzle), providing for consistent and reproducible micromachining of a variety of devices. Adapting the general method of the invention for use in a particular application will be within the capability of one skilled in the art to which that particular application belongs, without the need to perform undue experimentation.

Figure 3A:
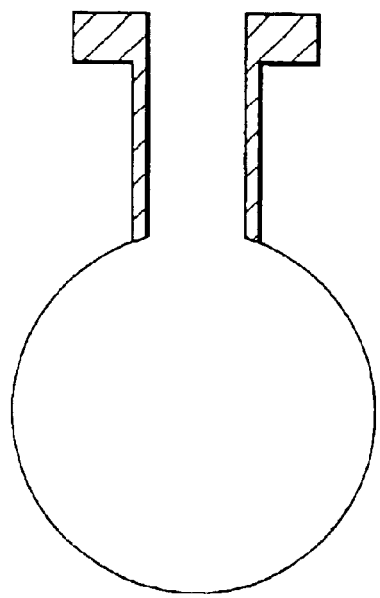
FIGS. 3A and 3B, respectively, show examples of round and horizontal elliptical shaped cavity profiles that can be obtained using the multi-step etch method of the invention.
Figure 3B:
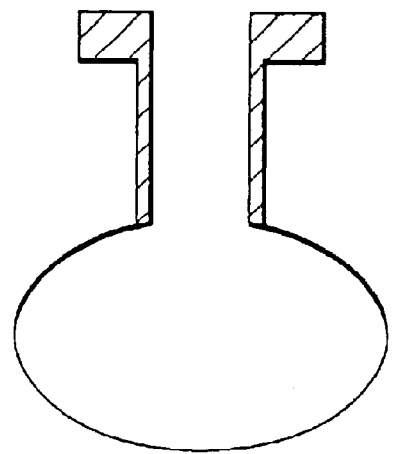

FIGS. 3A and 3B, respectively, show examples of round (i e., width≅depth) and horizontal elliptical (i.e., width>depth) shaped cavity profiles that can be obtained using the method of the invention.

Figure 3C:
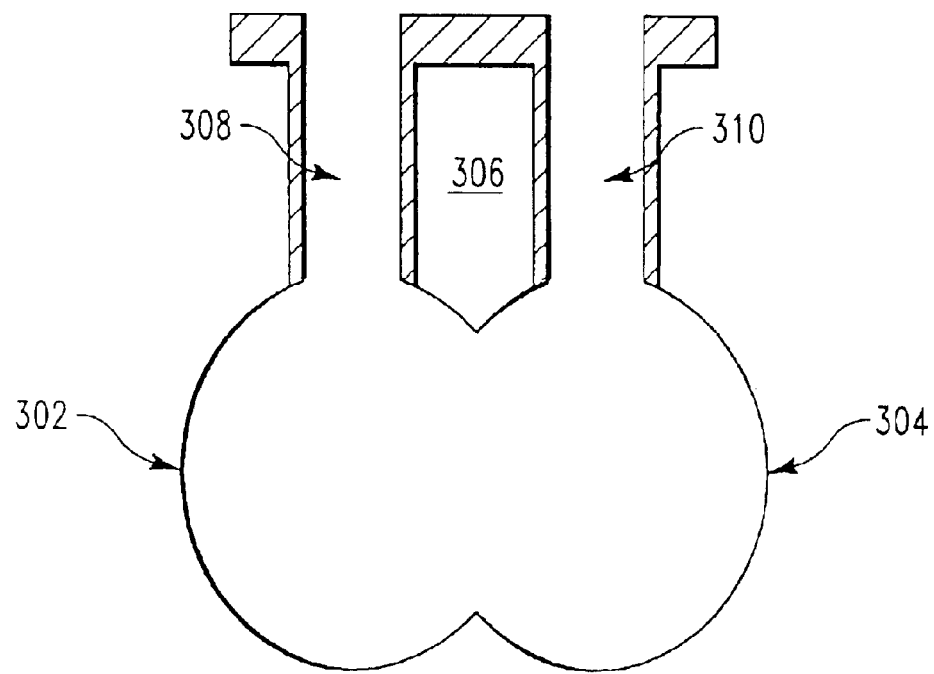
FIG. 3C shows a double spherical profile which is obtained by continued isotropic etching of closely adjacent shaped cavities 302 and 304, in order to remove the substrate material between the shaped cavities. By removing the substrate material between the shaped cavities, a silicon "island" 306 is formed between shaped openings 308 and 310. Such silicon islands are useful in, for example, DRAM capacitors, optical interconnects in optoelectronic integrated circuits, micromachining, and submicron silicon-on-insulator (SOI) applications.

FIG. 3C shows a double spherical profile which is obtained by continued isotropic etching of closely adjacent shaped cavities 302 and 304, in order to remove the substrate material between the shaped cavities. By removing the substrate material between the shaped cavities, a silicon "island" 306 is formed between shaped openings 308 and 310. Either the silicon islands or cavities themselves can be used as waveguides for optical interconnects in optoelectronic devices, or as a cantilever for an accelerometer, for example.

Using the method of the invention, with a shaped opening depth of from 0.8 µm to 2.0 µm, and a shaped opening width of from 3.5 to 4.5 µm, we have been able to form shaped cavities having a width that is from 2.5 to 4 times greater than the width of the overlying shaped opening, while maintaining a shaped cavity eccentricity of about 1. We have been successful in shaping a variety of features having an initial aspect ratio (ie., shaped opening depth: shaped opening width) of less than about 3.5:1. It is likely that we would be able to accomplish similar results at even higher aspect ratios.

Figure 4:
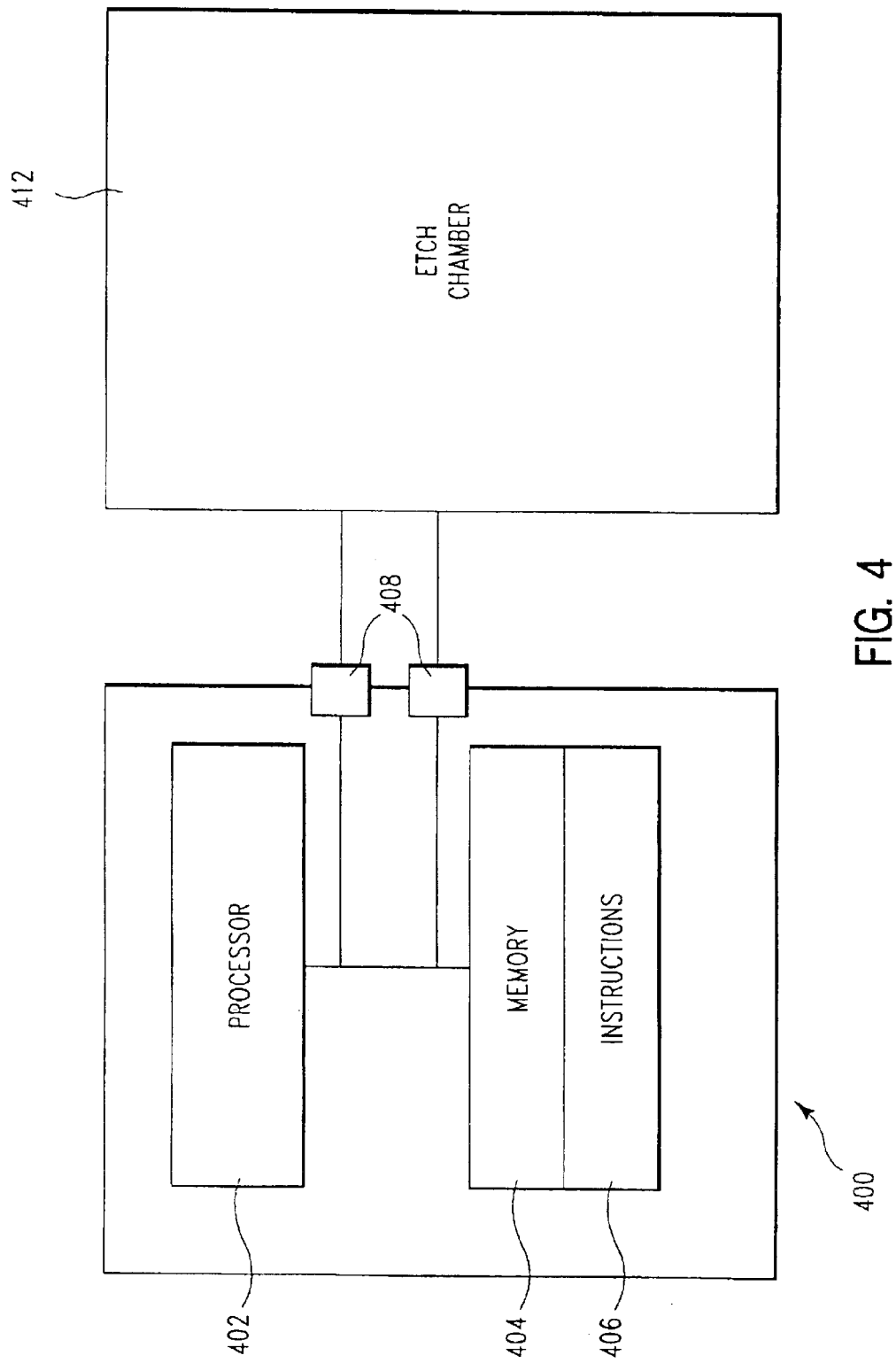
FIG. 4 is a schematic representation of an apparatus for practicing the present invention which includes elements for computerized control of the apparatus used to carry out the method of the invention.

Preferably, the apparatus used to practice the present invention is adapted to be controlled by a computer. FIG. 4 shows a computer 400. Computer 400 comprises a processor 402, memory 404 adapted to store instructions 406, and one or more ports 408, Processor 402 is adapted to communicate with memory 404 and to execute instructions 406. Processor 402 and memory 404 are also adapted to communicate with one or more ports 408. Ports 408 are adapted to communicate with an etch chamber 412. Chamber 412 is adapted to carry out process steps in accordance with signals received from processor 402 via ports 408. Preferably, computer 400 can control the composition and feed rate of the etch process feed gases, the process temperature, the pressure in the chamber, the time period for each process step, and other similar functions. Preferably, computer 400 is adapted to receive measurements that describe the conditions in the chamber or a condition of the substrate being etched, and adapt the process variables accordingly. This programmed control of process variables enables production of a predetermined device etch profile as required for a given use application.

One skilled in the art will recognize that a combination of etch steps at higher or lower chamber pressures, using varying ratios of active etchant to inert gas in the plasma source gas, and varying the plasma source power and substrate bias power can be used to obtain a cavity having a predetermined shape. The above described preferred embodiments are not intended to limit the scope of the present invention, as one skilled in the art can, in view of the present disclosure, expand such embodiments to correspond with the subject matter of the invention claimed below.

I claim:

1. A method of etching a shaped cavity in a substrate, wherein initial etching of said shaped cavity is performed using an initial process chamber pressure, wherein continued etching of the shaped cavity is performed using a process chamber pressure that is at least 25% lower than said initial process chamber pressure, and wherein etching of said shaped cavity is followed by an etch finishing step, wherein said etch finishing step is performed using a process chamber pressure that is within a range of about 80% to about 100% of said initial process chamber pressure.

2. The method of claim 1, wherein said substrate comprises single-crystal silicon, and etching is performed using a plasma containing reactive fluorine species.

3. The method of claim 2, wherein said plasma source gas further comprises an additive gas selected from the group consisting of $O_2$, HBr, $Cl_2$, $N_2$, and combinations thereof.

4. The method of claim 1, wherein etching is performed using a plasma generated from a source gas comprising a gas selected from the group consisting of $SF_6$, $CF_4$, $Cl_2$, HBr, and combinations thereof.

5. The method of claim 4, wherein said plasma source gas further comprises an essentially nonreactive, diluent gas selected from the group consisting of He and Xe.

6. The method of claim 4, wherein said plasma source gas further comprises an additive gas selected from the group consisting of Ar, $O_2$, $N_2$, and combinations thereof, wherein said additive gas is provided in an amount sufficient to improve profile control during etching.

7. The method of claim 6, wherein said plasma source gas further comprises an essentially nonreactive, diluent gas selected from the group consisting of He and Xe.

8. The method of claim 1, wherein said method includes performing the following steps prior to said initial cavity etch step: etching said substrate to a predetermined depth to form a shaped opening, then forming a conformal protective layer overlying at least a sidewall of said shaped opening, wherein said protective layer comprises a material having a different etch selectivity than said substrate.

9. The method of claim 8, wherein said substrate comprises single-crystal silicon and said protective layer comprises silicon oxide.

10. A method of etching a shaped cavity in a substrate, wherein the method comprises:
    a) an initial cavity etch step during which said substrate is etched to form a shaped cavity using an initial process chamber pressure;
    b) at least one additional etch step during which continued etching of said shaped cavity is performed using a process chamber pressure that is within a range of about 25% to about 50% lower than said initial process chamber pressure; and
    c) an additional etch step following step b), during which continued etching of said shaped cavity is performed using a process chamber pressure that is at least 40% lower than the process chamber pressure used during the performance of step b).

11. The method of claim 10, wherein said etch step c) is performed using a process chamber pressure that is within a range of about 40% to about 50% lower than the process chamber pressure used during the performance of etch step b).

12. The method of claim 10, wherein said method further comprises an etch finishing step, wherein said etch finishing step is performed using a process chamber pressure that is within a range of about 80% to about 100% of said initial process chamber pressure.

13. The method of claim 12, wherein said etch finishing step is performed using a process chamber pressure that is about 90% of said initial process chamber pressure.

14. The method of claim 10, or claim 12, wherein said substrate comprises single-crystal silicon, and etching is performed using a plasma containing reactive fluorine species.

15. The method of claim 14, wherein said plasma source gas further comprises an additive gas selected from the group consisting of $O_2$, HBr, $Cl_2$, $N_2$, and combinations thereof.

16. The method of claim 10 or claim 12, wherein etching is performed using a plasma generated from a source gas comprising a gas selected from the group consisting of $SF_6$, $CF_4$, $Cl_2$, HBr, and combinations thereof.

17. The method of claim 16, wherein said plasma source gas further comprises an essentially nonreactive, diluent gas selected from the group consisting of He and Xe.

18. The method of claim 16, wherein said plasma source gas further comprises an additive gas selected from the group consisting of Ar, $O_2$, $N_2$, and combinations thereof, wherein said additive gas is provided in an amount sufficient to improve profile control during etching.

19. The method of claim 18, wherein said plasma source gas further comprises an essentially nonreactive, diluent gas selected from the group consisting of He and Xe.

20. The method of claim 10 or claim 12, wherein said method includes performing the following steps prior to said initial cavity etch step: etching said substrate to a predetermined depth to form a shaped opening, then forming a conformal protective layer overlying at least a sidewall of said shaped opening, wherein said protective layer comprises a material having a different etch selectivity than said substrate.

21. The method of claim 20, wherein said substrate comprises single-crystal silicon and said protective layer comprises silicon oxide.

22. A method of etching a shaped cavity in a substrate, wherein the method comprises:
   a) an initial cavity etch step during which said substrate is etched to form a shaped cavity using an initial process chamber pressure; and
   b) at least one additional etch step during which continued etching of said shaped cavity is performed using a process chamber pressure that is at least 25% lower than said initial process chamber pressure, wherein etching is performed using a plasma which consists essentially of chemically reactive species generated from $SF_6$ which are used in combination with species generated from an inert gas.

23. The method of claim 22 wherein said inert gas is selected from the group consisting of Ar, He and Xe.

24. The method of claim 22, wherein said at least one additional etch step includes a first etch step which is performed using a process chamber pressure that is within a range of about 30% to about 50% lower than said initial process chamber pressure.

25. The method of claim 24, wherein said first etch step is performed using a process chamber pressure that is about 30% lower than said initial process chamber pressure.

26. A method of etching a shaped cavity in a single crystal silicon substrate, wherein the method comprises:
   a) an initial cavity etch step during which said single crystal silicon substrate is etched to form a shaped cavity using an initial process chamber pressure; and
   b) at least one additional etch step during which continued etching of said shaped cavity is performed using a process chamber pressure that is at least 25% lower than said initial process chamber pressure, wherein etching is performed using a plasma generated from a source gas comprising $SF_6$ and Ar, wherein said at least one additional etch step includes a first additional etch step which is performed using a process chamber pressure that is within a range of about 30% to about 50% lower than said initial process chamber pressure, and wherein said at least one additional etch stop further includes a second additional etch step during which continued etching of said shaped cavity is performed using a process chamber pressure that is at least 40% lower than the process chamber pressure used during the performance of said first additional etch step.

27. The method of claim 26, wherein said second additional etch step is performed using a process chamber pressure that is within a range of about 40% to about 50% lower than the process chamber pressure used during the performance of said first additional etch step.

28. A method of etching a shaped cavity in a single crystal silicon substrate, wherein the method comprises:
   a) an initial cavity etch step during which said single crystal silicon substrate is etched to form a shaped cavity using an initial process chamber pressure; and
   b) at least one additional etch step during which continued etching of said shaped cavity is performed using a process chamber pressure that is at least 25% lower than said initial process chamber pressure, wherein etching is performed using a plasma generated from a source gas comprising $SF_6$ and Ar, and wherein, subsequent to said at least one additional etch step, an etch finishing step is performed using a process chamber pressure that is within a range of about 80% to about 100% of said initial process chamber pressure.

29. The method of claim 28, wherein said etch finishing step is performed using a process chamber pressure that is about 90% of said initial process chamber pressure.

30. The method of claim 26 or claim 28, wherein said plasma source gas further comprises an additive gas selected from the group consisting of $O_2$, HBr, $Cl_2$, $N_2$, and combinations thereof.

31. The method of claim 26 or claim 28, wherein said plasma source gas further comprises an additive gas selected from the group consisting of Ar, $O_2$, HBr, $Cl_2$, $N_2$, and combinations thereof, wherein said additive gas is provided in an amount sufficient to improve profile control during etching.

32. The method of claim 22, 26 or claim 28, wherein said method includes performing the following steps prior to said initial cavity etch step: etching said substrate to a predetermined depth to form a shaped opening, then forming a conformal protective layer overlying at least a sidewall of said shaped opening, wherein said protective layer comprises a material having a different etch selectivity than said substrate.

33. The method of claim 32, wherein said protective layer comprises silicon oxide.

34. A method of etching a shaped cavity in a substrate, wherein the method comprises:
   a) etching said substrate to a predetermined depth to form a shaped opening;
   b) forming a conformal protective layer overlying at least a sidewall of said shaped opening, wherein said protective layer comprises a material having a different etch selectivity than said substrate;
   c) an initial cavity etch step during which said substrate is etched to form a shaped cavity using an initial process chamber pressure; and
   d) at least one additional etch step during which continued etching of said shaped cavity is performed using a process chamber pressure that is at least 25% lower than said initial process chamber pressure, wherein said at least one additional etch step includes a first additional etch step which is performed using a process chamber pressure that is within a range of about 30% to about 50% lower than said initial process chamber pressure, and wherein said at least one additional etch step further includes a second additional etch step during which continued etching of said shaped cavity is performed using a process chamber pressure that is at least 40% lower than the process chamber pressure used during the performance of said first additional etch step.

35. The method of claim 34, wherein said second additional etch step is performed using a process chamber pressure that is within a range of about 40% to about 50% lower than the process chamber pressure used during the performance of said first additional etch step.

36. The method of claim 34, wherein, subsequent to said at least one additional etch step, an etch finishing step is performed using a process chamber pressure that is within a range of about 80% to about 100% of said initial process chamber pressure.

37. The method of claim 36, wherein said etch finishing step is performed using a process chamber that is about 90% of said initial process chamber pressure.

* * * * *